United States Patent [19]
Oh

[11] Patent Number: 5,283,765
[45] Date of Patent: Feb. 1, 1994

[54] ADDRESS INPUT BUFFER CIRCUIT FOR A SEMI-CONDUCTOR STORAGE DEVICE

[75] Inventor: Jong H. Oh, Ichonkun, Rep. of Korea

[73] Assignee: Hyundai Electronics Industries Co., Ltd., Ichonkun, Rep. of Korea

[21] Appl. No.: 728,145

[22] Filed: Jul. 10, 1991

[30] Foreign Application Priority Data

Jul. 12, 1990 [KR] Rep. of Korea ............... 1990/10590

[51] Int. Cl.$^5$ ................................. G11C 8/00
[52] U.S. Cl. ..................... 365/230.08; 365/189.05
[58] Field of Search ............... 365/189.05, 203, 207, 365/230.06, 230.08

[56] References Cited

U.S. PATENT DOCUMENTS

4,618,947 10/1986 Tran et al. ............... 365/230.08 X

Primary Examiner—Steven Mottola
Attorney, Agent, or Firm—Darby & Darby

[57] ABSTRACT

An address input buffer circuit for a semi-conductor storage device, comprising an input circuit 62 being controlled by an external input address signal An, an internal reference voltage signal Vref and a setup enable signal φAXE; a setup circuit 63 connected to both stages of said input circuit 62; a sense amplifying circuit 61 connected to both stages of said setup circuit 63; a pair of charging circuits 67 and 68 connected to said both stages of said setup circuit 63 respectively and to a power source; a pair of hold circuits 64 and 65 connected to said both stages of said setup circuit 63 respectively; a drive circuit 66 connected to said sense amplifying circuit 61; and an output circuit 71 connected to said pair of hold circuits 64 and 65. Therefore, the address input buffer circuit for the semi-conductor storage device according to the present invention is capable of realizing a high speed operation by directly performing an address setup operation in order to remove the setup time period and therefore to shorten the access time period.

9 Claims, 9 Drawing Sheets

ADDRESS INPUT BUFFER CIRCUIT FOR A SEMI-CONDUCTOR STORAGE DEVICE

BACKGROUND OF THE INVENTION

1. Field of the Invention

The present invention relates in general to an address input buffer circuit for a semi-conductor storage device, for inputting an address for selection of a specific location of the storage device, and more particularly to the address input buffer circuit having high speed and latching operation characteristics.

2. Description of the Prior Art

In all semi-conductor storage devices employing complementary MOS (CMOS) techniques, conventionally, there has necessarily been used an address input buffer circuit having an active region in which the voltage input high (VIH) of TTL potential is above 2.4 V and the voltage input low (VIL) thereof is below 0.8 V. More particularly, in a dynamic RAM (DRAM), there have been employed address input buffer circuits for X and Y-addresses. Herein, the address input buffer circuit for the X-address is believed to require a high speed, dynamic latching operation characteristic. Also, the address input buffer circuit for the Y-address is believed to require a static operation characteristic even in a low speed for realization of a successive column cycle, i.e., a fast page mode or a static column mode.

Figure 1:
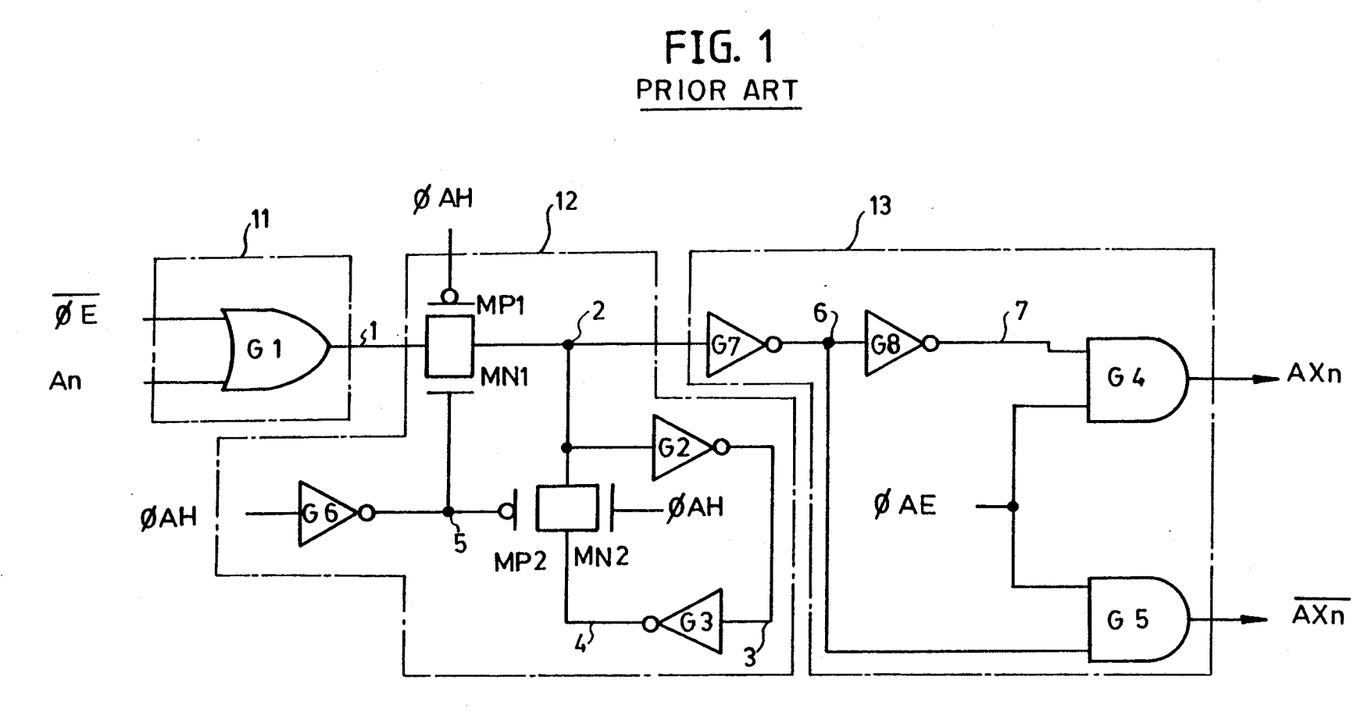
FIG. 1 is a circuit diagram of a conventional address input buffer circuit employing logic gates.

Referring to FIG. 1, there is shown a circuit diagram of a conventional address input buffer circuit employing logic gates. In this drawing, the conventional address input buffer circuit is shown to comprise an input circuit 11, a switching and latching circuit 12 and an output circuit 13.

The input circuit 11 is provided with an OR gate G1 including one input terminal for inputting an external input address signal An and the other input terminal for inputting an input enable signal $\phi$E.

The switching and latching circuit 12 is provided with a switching circuit including p-channel MOSFETs MP1 and MP2 and n-channel MOSFETs MN1 and MN2, an inverter G6 for inputting an address interrupt signal $\phi$AH, and inverters G2 and G3 for latch-functioning.

On the other hand, the output circuit 13 is provided with inverters G7 and G8, an AND gate G4 including one input terminal for inputting an output signal from the inverter G8 and the other input terminal for inputting an address output enable signal $\phi$AE and an AND gate G5 including one input terminal for inputting the address output enable signal $\phi$AE and the other input terminal for inputting an output signal from the inverter G7.

Figure 2:
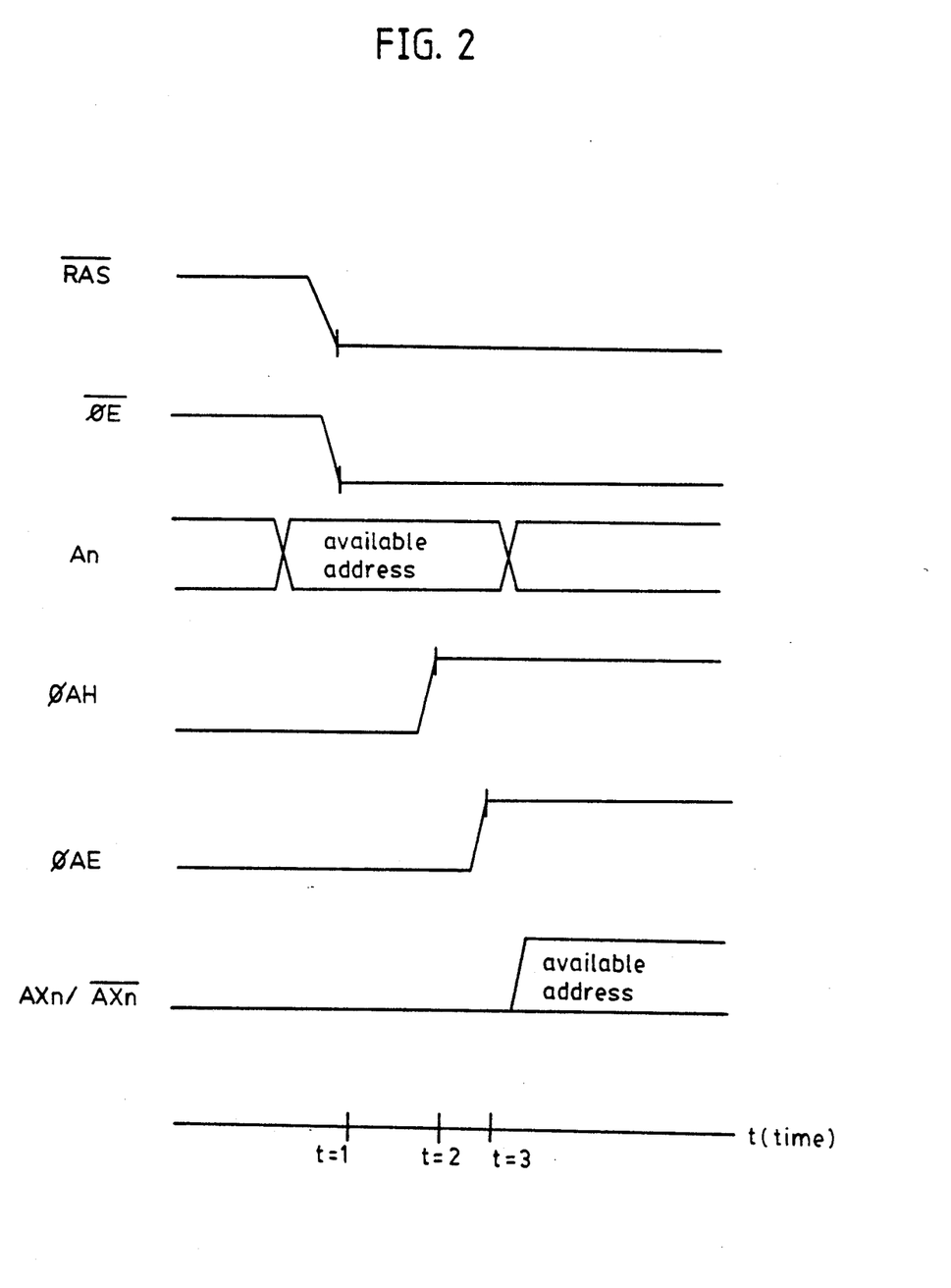
FIG. 2 is a waveform diagram of signals from respective components in FIG. 1.

The operation of the conventional address input buffer circuit with the above-mentioned construction will now be mentioned with reference to FIG. 2 which is a waveform diagram of signals from respective components in FIG. 1.

Because the input enable signal $\phi$E is high and the address output enable signal $\phi$AE is low during the time period of t<t1, the OR gate G1 outputs a high signal regardless of the other input state and the AND gates G4 and G5 each outputs a low signal regardless of the other input state.

If a drive input signal $\overline{RAS}$ to the dynamic RAM device is transited from a high state to a low state at instant t=t1, an active operation of the device is initiated and the input enable signal $\phi$E is transited from the high state to a low state. As a result, the OR gate G1 outputs the transited state of the external input address signal An previously inputted at the other input terminal. The transited state of the external input address signal An is then transferred to a node 2, or an output stage of the switching circuit defined by the MOSFETs MP1 and MN1 each including its gate for inputting the inverted signal of the address interrupt signal $\phi$AH, to a node 3 in a logic gate transfer manner and to nodes 6 and 7 in the output circuit 13. For example, supposing that the external input address signal An is high, signals at nodes 1, 2, 4 and 7 are maintained at a high state and signals at nodes 3 and 6 are maintained at a low state, while supposing that the external input address signal An is low, signals at nodes 1, 2, 4 and 7 are maintained at a low state and signals at nodes 3 and 6 are maintained at a high state.

If the address interrupt signal $\phi$AH is transited from a low state to a high state at instant t=t2, a switch comprised of the MOSFETs MP2 and MN2 each including its gate for inputting the address interrupt signal $\phi$AH is turned on, while a switch comprised of the MOSFETs MP1 and MN1 each including its gate for inputting the inverted signal of the address interrupt signal $\phi$AH is turned off, thereby allowing an external input to the device and therefore an external noise thereto to be broken, and the node 2, or an input stage of the output circuit 13 to be latched by the inverters G2 and G3.

If the address output enable signal $\phi$AE is transited from the low state to a high state at instant t=t3, the AND gates G4 and G5 are enabled and hence states of two internal address signals, or complement signals AXn and $\overline{AXn}$ are determined in accordance with a state of the external input address signal An.

However, although the above-mentioned conventional address input buffer circuit employing logic gates may embody a static operation by means of logic elements contained therein, there is a limit to its high speed realization due to delay time of the logic gates.

Figure 3:
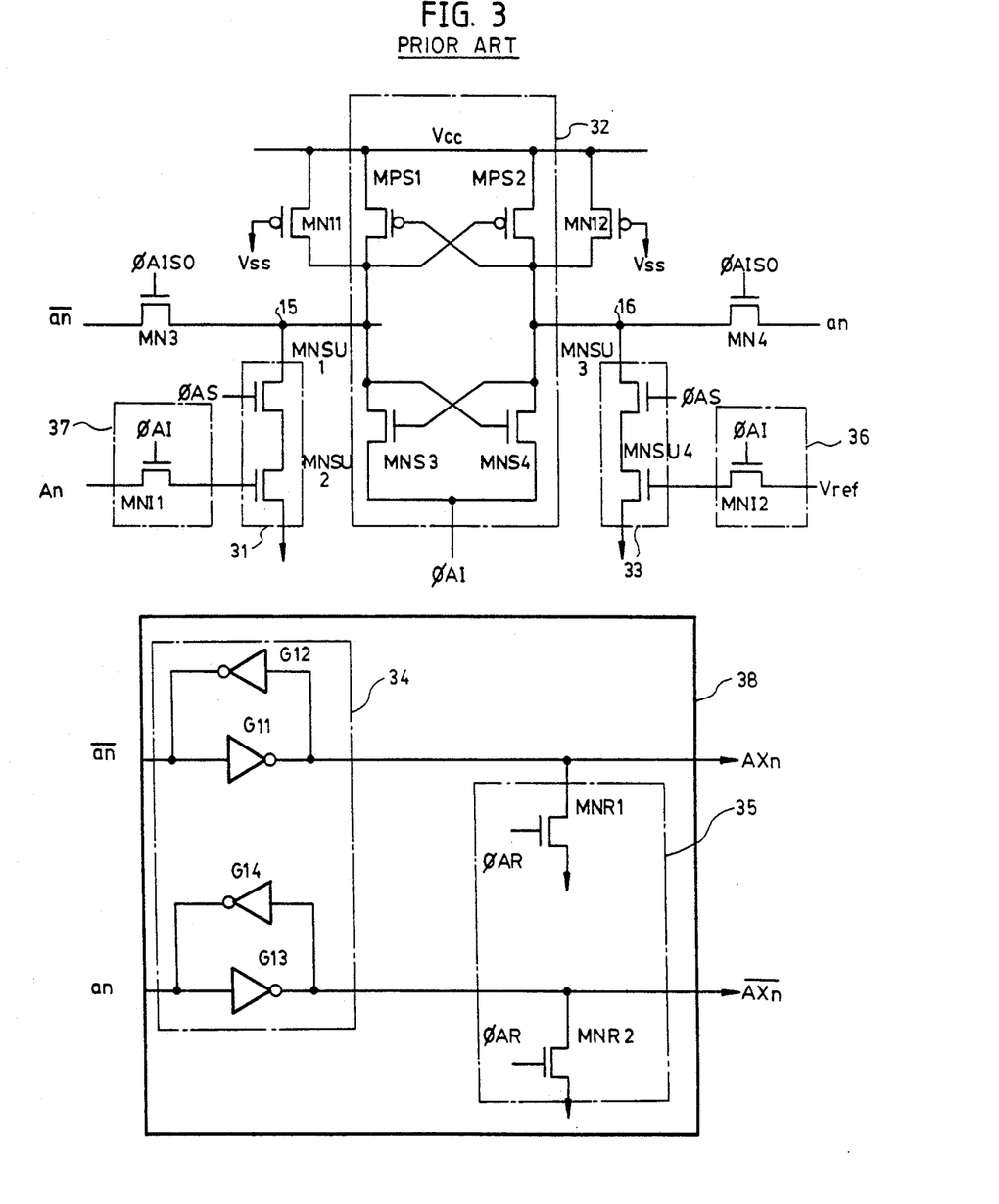
FIG. 3 is a circuit diagram of another conventional address input buffer circuit utilizing cross-coupled flip-flops.

Referring to FIG. 3, there is shown a circuit diagram of another conventional address input buffer circuit utilizing cross-coupled flip-flops. This address input buffer circuit employs a sample and hold latching manner utilizing cross-coupled flip-flops for the purpose of the improvement in the above-mentioned problems with above conventional circuit. This address input buffer circuit has been adopted for 1M DRAM and 4M DRAM, each available from TOSHIBA Co., Ltd.

In FIG. 3, the conventional address input buffer circuit utilizing cross-coupled flip-flops is shown to comprise a pair of input circuits 36 and 37, a pair of setup circuits 31 and 33, a sense amplifying circuit 32 and an output circuit 38.

The input circuit 37 is provided with a n-channel MOSFET MNI1 including its gate for inputting an address input signal $\phi$AI and its drain for inputting an external input address signal An. Also, the input circuit 36 is provided with a n-channel MOSFET MNI2 including its gate for inputting the address input signal $\phi$AI and its drain for inputting an internal reference voltage signal Vref.

The setup circuit 31 is provided with series connected n-channel MOSFETs MNSU1 and MNSU2 for performing an address setup operation. Also, the setup circuit 33 is provided with series connected n-channel MOSFETs MNSU3 and MNSU4 for performing the address setup operation.

The sense amplifying circuit 32 includes cross-coupled p-channel MOSFETs MPS1 and MPS2 and cross-coupled n-channel MOSFETs MNS3 and MNS4.

The output circuit 38 is provided with a latching circuit 34 including a plurality of inverters G11 to G14, and an address reset circuit 35 including a pair of n-channel MOSFETs MNR1 and MNR2, each including its gate for inputting an address reset signal φAR.

The internal reference voltage signal Vref represents a voltage generated for discrimination of an input level of a TTL potential in the device. For the purpose of the provision of the same margin for both of high and low voltages inputted to the device, the internal reference voltage signal Vref is usually maintained at the level of 1.6 V as defined by equation as follows:

$$Vref = \frac{VIL \cdot MAX + VIH \cdot MIN}{2} = \frac{0.8 + 2.4}{2} = 1.6 \text{ V}$$

Now, the operation of the conventional address input buffer circuit utilizing cross-coupled flip-flops of the construction as mentioned above will be mentioned with reference to FIG. 4.

Figure 4:
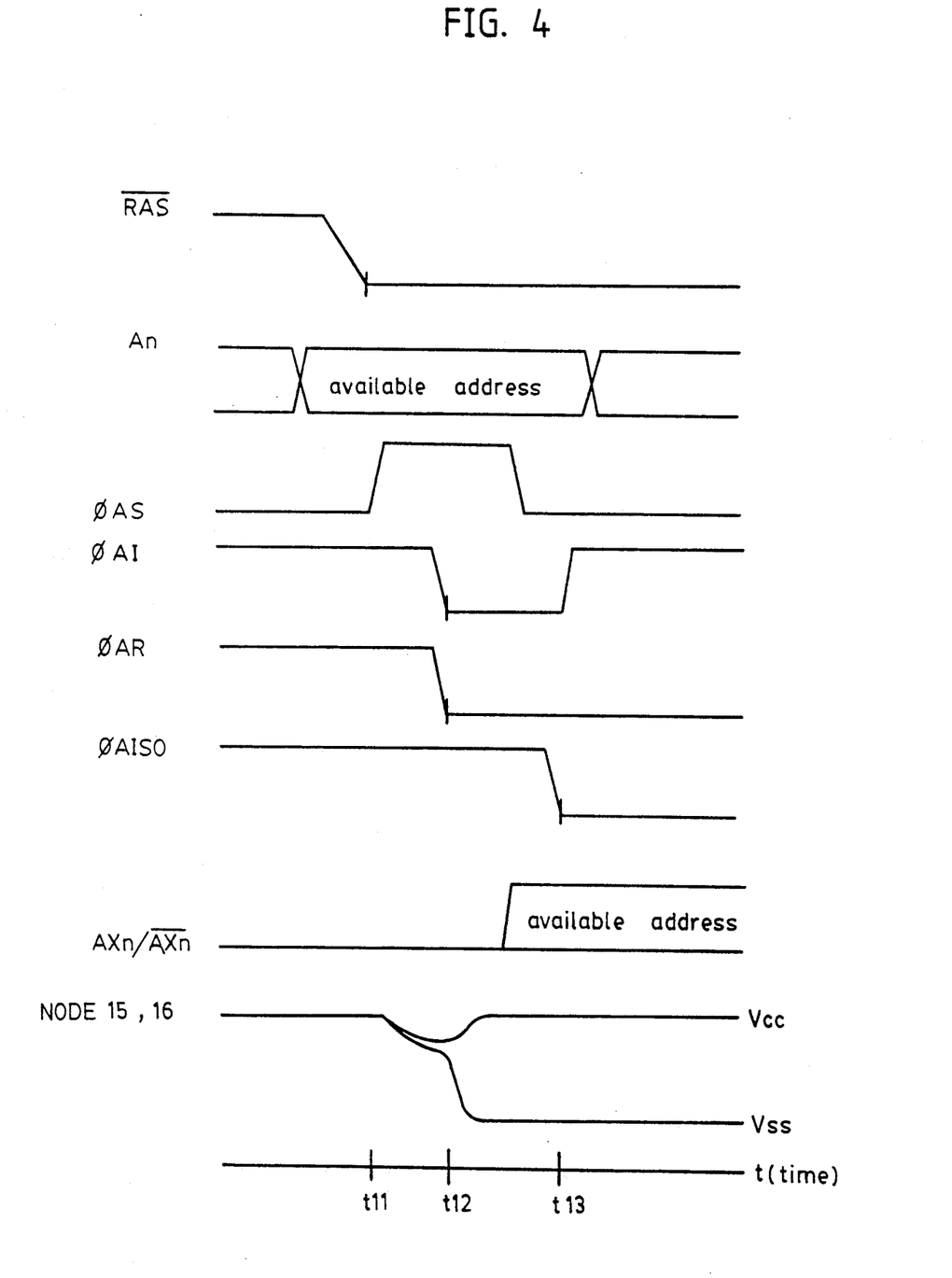
FIG. 4 is a waveform diagram of signals from respective components in FIG. 3.

Referring to FIG. 4, there is shown a waveform diagram of signals from respective components in FIG. 3.

Because the address input signal φAI and the address reset signal φAR are high during the time period of t<t11, the external input address signal An and the internal reference voltage signal Vref are transferred respectively to the setup circuits 31 and 33 respectively through the n-channel MOSFETs MNI1 and MNI2 and hence two internal address signals, or complement signals AXn and $\overline{AXn}$ are low in accordance with the high state of the address reset signal φAR.

If an address setup signal φAS is transited from a low state to a high state at instant t=t11, the setup circuit 31 including series connected n-channel MOSFETs MNSU1 and MNSU2 and the setup circuit 33 including series connected n-channel MOSFETs MNSU3 and MNSU4 operate such that potentials at both nodes 15 and 16 of the sense amplifying circuit 32 having been charged with source voltage Vcc are discharged respectively by the external input address signal An and the internal reference voltage signal Vref. As a result, there is generated a potential difference between the both nodes 15 and 16. Therefore, upon the enabling of the address setup signal φAS, the external input address signal An is set up at the both nodes 15 and 16 of the sense amplifying circuit 32 by the setup circuits 31 and 33. If the address input signal φAI is transited from the high state to a low state at instant t=t12, the n-channel MOSFETs MNI1 and MNI2 in the input circuits 37 and 36 are turned off, thereby allowing an external input to the device to be broken, and the sense amplifying circuit 32 to amplify the set up potential difference between the both nodes 15 and 16.

At this time, if the address reset signal φAR is transited from the high state to a low state, address signals an and $\overline{an}$ outputted from the sense amplifying circuit 32 are transferred directly to the latching circuit 34 respectively through n-channel MOSFETs MN3 and MN4, with being placed respectively on the internal address signals AXn and $\overline{AXn}$.

If a control signal φAISO is transited from a high state to a low state at instant t=t13, the input address signals an and $\overline{an}$ are latched by the latching circuit 34 and the latched state of the address signals is maintained until the subsequent address reset.

Figure 5:
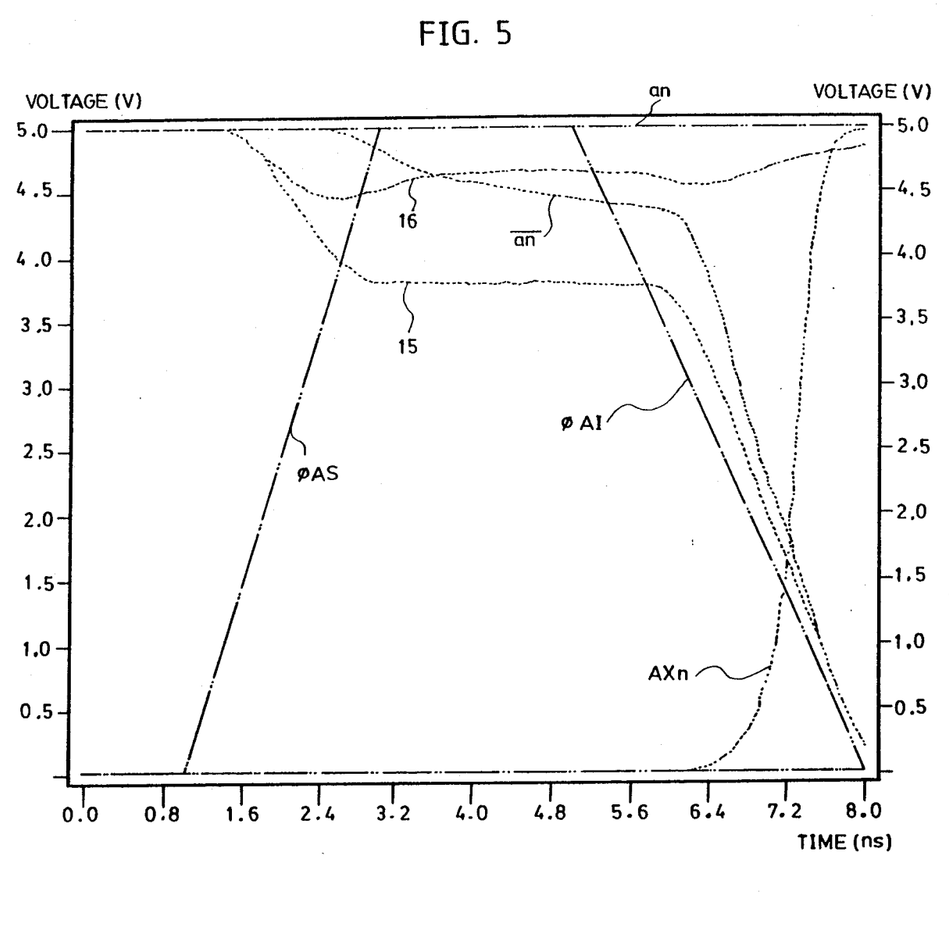
FIG. 5 is a signal waveform diagram according to a result simulated with the conventional address input buffer circuit in FIG. 3.

FIG. 5 is a signal waveform diagram according to a result simulated with the conventional address input buffer circuit utilizing cross-coupled flip-flops.

However, the conventional address input buffer circuit utilizing cross-coupled flip-flops is difficult to realize a high speed operation in that it sets up the previously arrived address signals at the both nodes 15 and 16 of the sense amplifying circuit 32 by means of the setup circuits 31 and 33 during the time period of t11<t<t12 as shown in FIG. 5.

In addition, the discharging of potentials at the both nodes 15 and 16 having been charged with the source voltage Vcc induces indirectly the potential difference between the both nodes 15 and 16, thereby causing the potential difference to be lower than an actual potential difference between the external input address signal An and the internal reference voltage signal Vref.

SUMMARY OF THE INVENTION

Therefore, it is an object of the present invention to provide an address input buffer circuit for a semi-conductor storage device, for realizing a high speed operation by directly performing an address setup operation in order to remove the setup time period and therefore to shorten the access time period.

In accordance with the present invention, the object can be accomplished by providing an address input buffer circuit for a semi-conductor storage device, comprising: input means being controlled by an external input address signal, an internal reference voltage signal and a setup enable signal; setup means connected to both stages of said input means; sense amplifying means connected to both stages of said setup means; a pair of charging means connected to said both stages of said setup means respectively and to a power source, said pair of charging means being controlled by a precharge signal; a pair of hold means connected to said both stages of said setup means respectively, said pair of hold means being controlled by a hold signal; drive means connected to said sense amplifying means, said drive means being controlled by a sense signal; and output means connected to said pair of hold means.

BRIEF DESCRIPTION OF THE DRAWINGS

The above and other objects, features and advantages of the present invention will be more clearly understood from the following detailed description taken in conjunction with the accompanying drawings, in which:

FIG. 6b is the output circuit for the address input buffer of FIG. 6a;

DETAILED DESCRIPTION OF PREFERRED EMBODIMENTS

Figure 6A:
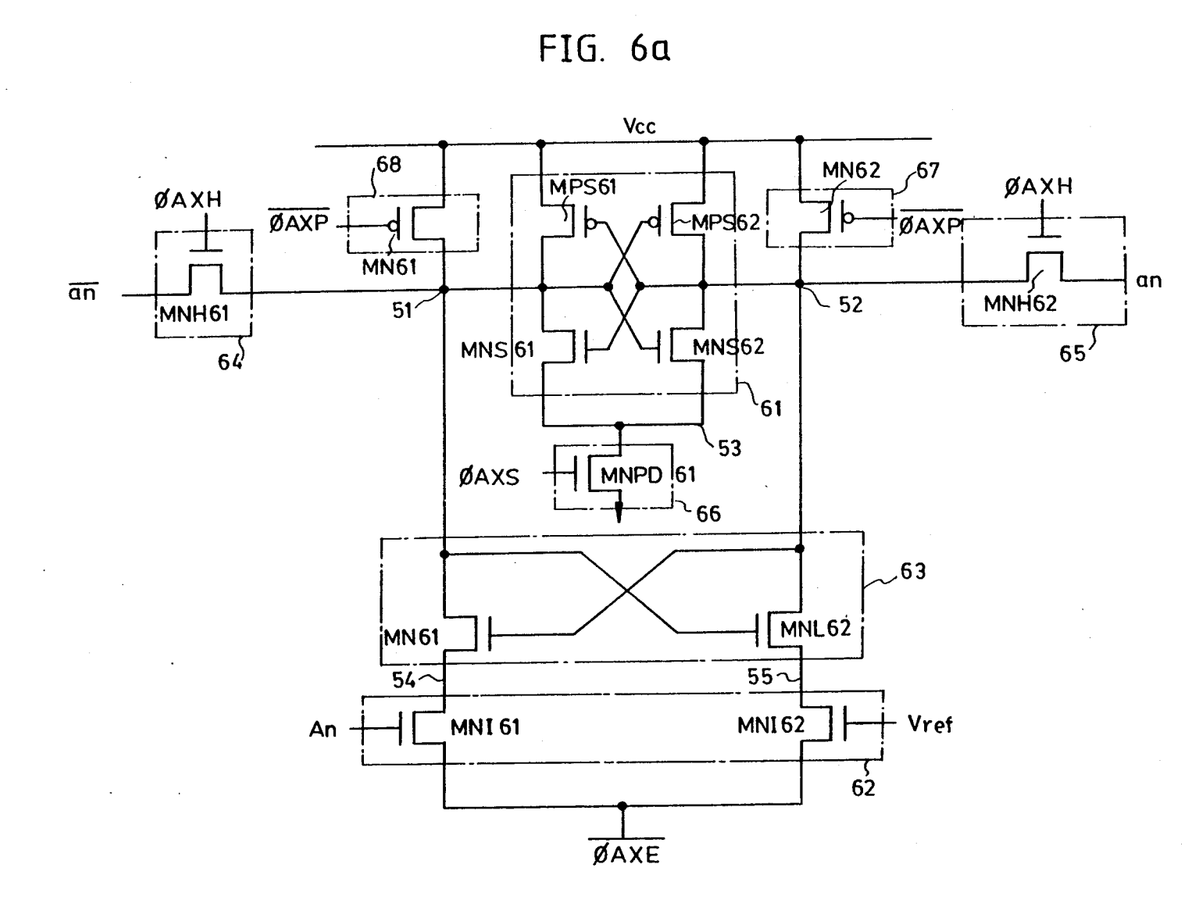
FIG. 6a is a circuit diagram of the main portion of an address input buffer circuit of the present invention.
Figure 6B:
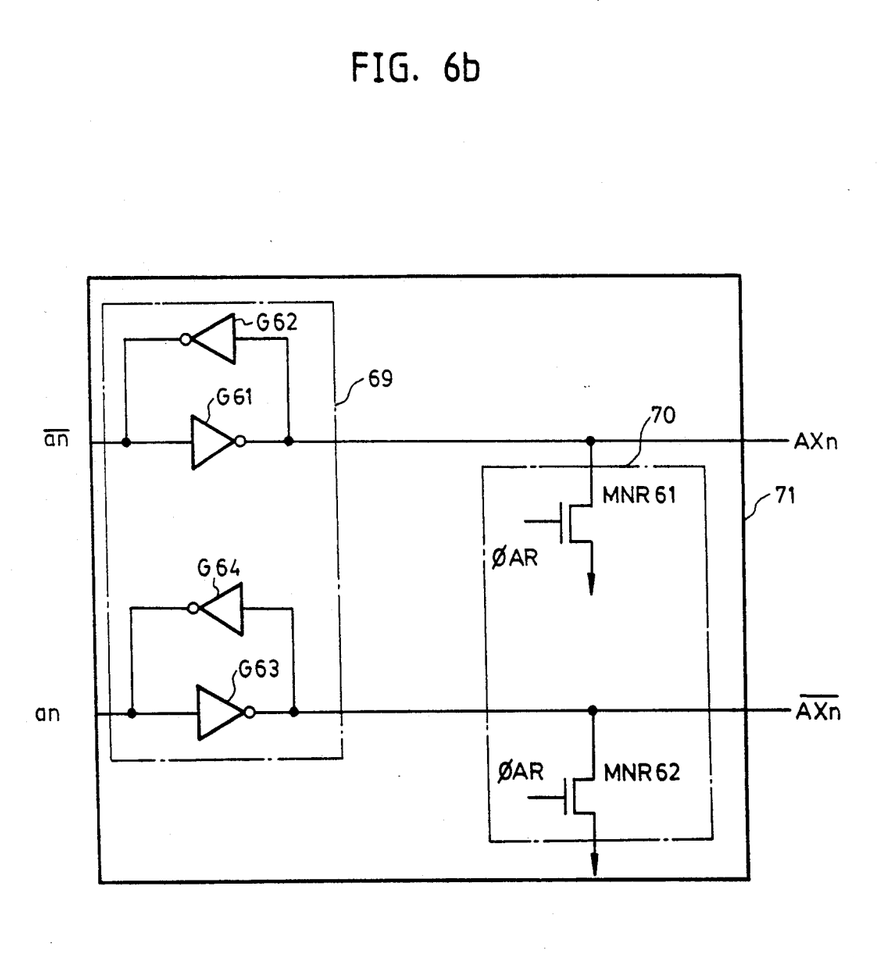
Figure 7:
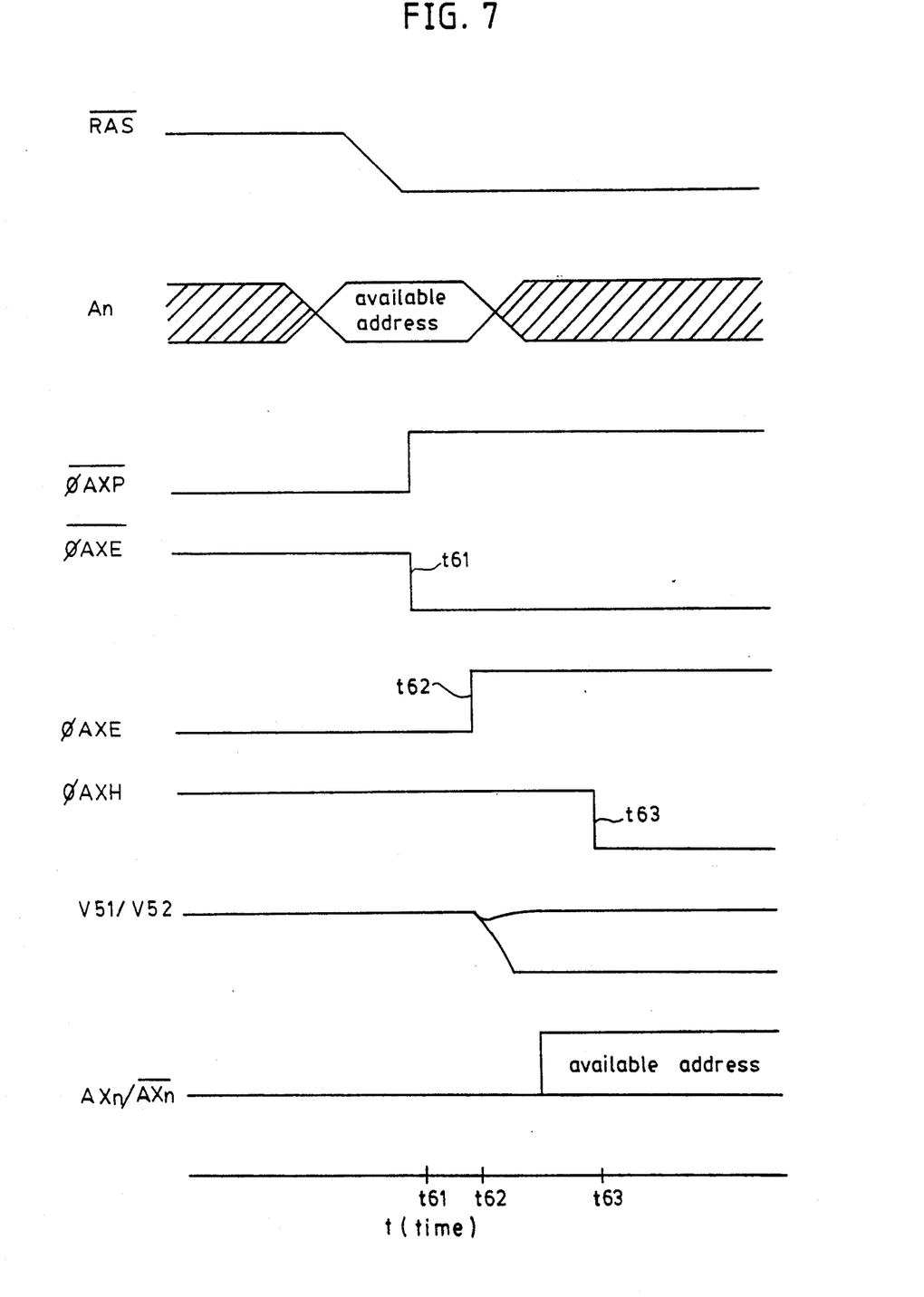
FIG. 7 is a waveform diagram of signals from respective components in FIG. 6.
Figure 8:
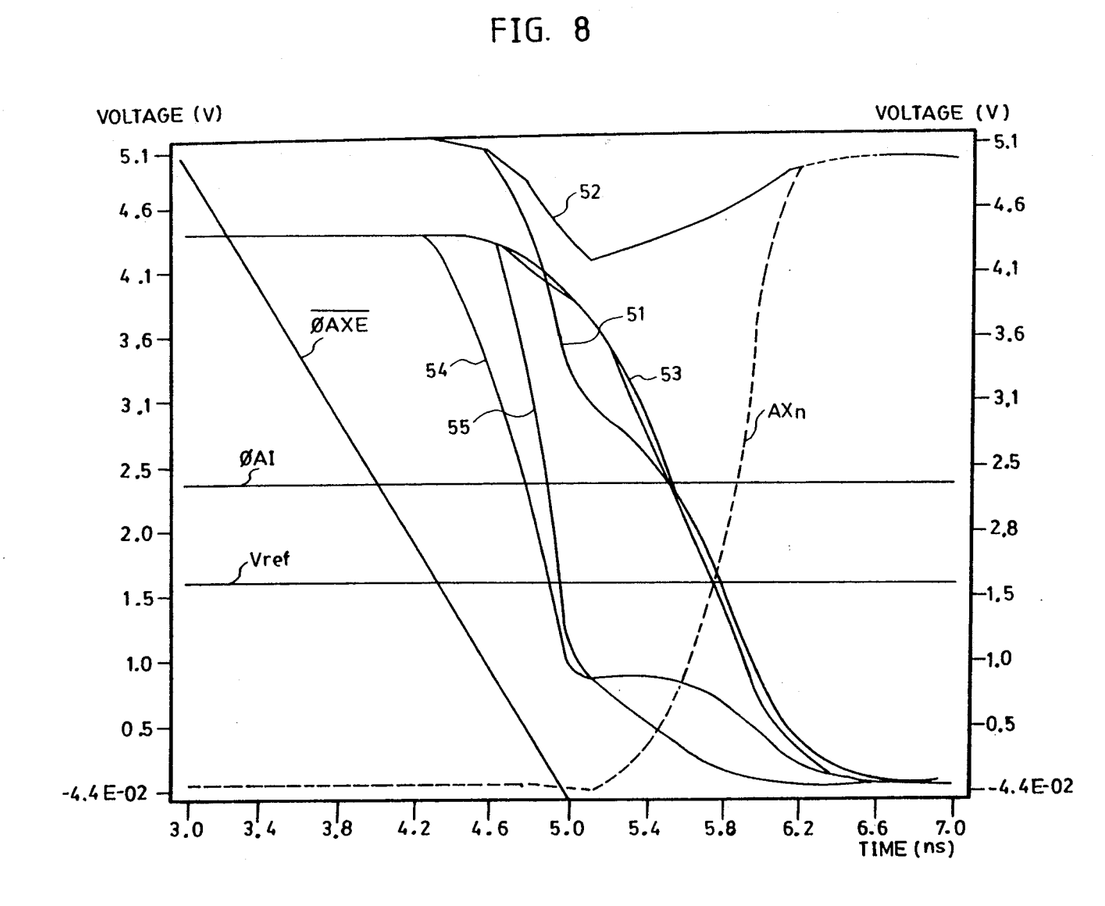
FIG. 8 is a signal waveform diagram according to a result simulated with the address input buffer circuit of the present invention in FIG. 3.

FIGS. 6a and 6b comprise is a circuit diagram of an address input buffer circuit of the present invention, FIG. 7 is a waveform diagram of signals from respective components in FIGS. 6a and 6b, and FIG. 8 is a signal waveform diagram according to a result simulated with the address input buffer circuit of the present invention in FIG. 3. In these drawings, the reference numeral 61 designates a sense amplifying circuit, 62 an input circuit, 63 a setup circuit, 64 and 65 hold circuits, 66 a drive circuit, 67 and 68 charging circuits, 69 a latching circuit, 70 an address reset circuit, 71 output circuit, MN61, MN62, MNH61, MNH62, MPS61, MPS62, MNS61, MNS62, MNPD61, MNL61, MNL62, MNI61, MNI62, MNR61 and MNR62 MOSFETs, and G61 through G64 inverters, respectively.

First, a construction of an address input buffer circuit in accordance with the present invention will be described with reference to FIGS. 6a and 6b.

Referring to FIGS. 6a and 6b, the address input buffer circuit in accordance with the present invention is shown to comprise a sense amplifying circuit 61, a drive circuit 66 connected to one stage of the sense amplifying circuit 61, a pair of hold circuits 64 and 65 connected to the other stage of the sense amplifying circuit 61, a pair of charging circuits 67 and 68, a setup circuit 63, an input circuit 62 connected to the setup circuit 63, and an output circuit 71 (FIG. 6b) connected to the hold circuits 64 and 65.

The input circuit 62 is provided with a pair of n-channel MOSFETs MNI61 and MNI62. The n-channel MOSFET MNI61 includes its gate for inputting an external input address signal An and its source for inputting a setup enable signal $\phi$AXE. Also, the n-channel MOSFET MNI62 includes its gate for inputting an internal reference voltage signal Vref and its source for inputting the setup enable signal $\phi$AXE. The setup enable signal $\phi$AXE is transited from a high state to a low state for induction of a potential difference between the external input address signal An and the internal reference voltage signal Vref and initial amplification of the potential difference.

The setup circuit 63 is provided with a latching circuit including a pair of n-channel MOSFETs MNL61 and MNL62 cross-coupled in a positive-feedback manner.

The hold circuits 64 and 65 are provided respectively with n-channel MOSFETs MNH61 and MNH62, each including its drain connected to the output stage of the sense amplifying circuit 61 and its gate for inputting a hold signal $\phi$AXH. The hold signal $\phi$AXH is transited to an initial state for latching of an address signal during a predetermined time period when the address signal developed at the output stage of the sense amplifying circuit 61 is outputted through the output circuit 71 (FIG. 6b) via full transfer.

The sense amplifying circuit 61 includes a pair of cross-coupled p-channel MOSFETs MPS61 and MPS62 and a pair of cross-coupled n-channel MOSFETs MNS61 and MNS62.

The drive circuit 66 is provided with a n-channel MOSFET MNPD61 including its gate for inputting a sense signal $\phi$AXS and its drain connected to the one stage of the sense amplifying circuit 61.

The charging circuits 67 and 68 are provided respectively with n-channel MOSFETs MN61 and MN62, respective MOSFETs MN61 and MN62 including their drains connected to Vcc power source, their gates for inputting a precharge signal $\phi$AXP of buffer and their sources connected respectively to nodes 51 and 52, or input stages of the hold circuits 64 and 65.

The output circuit 71, depicted in FIG. 6b, includes a latching circuit 69 and an address reset circuit 70.

The latching circuit 69 is provided with a plurality of inverters G61 through G64. Also, the address reset circuit 70 is provided with a pair of n-channel MOSFETs MNR61 and MNR62, each including its gate for inputting an address reset signal $\phi$AR and its drain connected to an output stage of the latching circuit 69.

Next, the operation of the address input buffer circuit with the above-mentioned construction according to the present invention will be mentioned in detail with reference to FIG. 7.

During the time period of $t<t61$ that a drive input signal $\overline{RAS}$ to the dynamic RAM device is high, because the precharge signal $\phi$AXP of buffer is 0V, the setup enable signal $\phi$AXE is source voltage Vcc and the sense signal $\phi$AXS is low, the n-channel MOSFETs MN61 and MN62 are turned on, thereby causing the nodes 51 and 52 to be charged with the source voltage Vcc. On the other hand, the n-channel MOSFET MNPD61 in the drive circuit 66 is turned off, thereby causing a potential lower by a threshold voltage Vth of the n-channel MOSFETs MNS61 and MNS62 than the source voltage Vcc to be maintained at the node 53 due to a loss of the threshold voltage Vth. Also, the n-channel MOSFETs MNL61 and MNL62 in the setup circuit 63 are turned on and the n-channel MOSFETs MNI61 and MNI62 in the input circuit 62 are turned off, thereby causing a potential lower by a threshold voltage Vth of the n-channel MOSFETs MNL61 and MNL62 than the source voltage Vcc to be maintained at nodes 54 and 55, output stages of the input circuit 62. During the time period of $t<t61$, the external input address signal An and the internal reference voltage signal Vref inputted respectively at the gates of the n-channel MOSFETs MNI61 and MNI62 in the input circuit 62 are arrived at a stable state and hence a valid address is maintained.

If the setup enable signal $\phi$AXE is transited from the source voltage Vcc to 0 V at instant $t=t61$, the n-channel MOSFETs MNI61 and MNI62 in the input circuit 62 are turned on, thereby causing the potential at the nodes 54 and 55 to begin to be discharged. The level of this discharging is mainly dependent on levels of the external input address signal An and the internal reference voltage signal Vref inputted respectively at the gates of the n-channel MOSFETs MNI61 and MNI62 in the input circuit 62. Therefore, the cross-coupling of the n-channel MOSFETs MNL61 and MNL62 in the setup circuit 63 has the effect of positive-feedback.

For instance, supposing that the potential of the external input address signal An is 3 V, the potential of the internal reference voltage signal Vref is 1.6 V and hence the magnitude of the discharging current through the n-channel MOSFET MNI61 is higher than that through the n-channel MOSFET MNI62, thereby causing the potential at the node 51 to be discharged more than that at the node 52. For this reason, the amount of the discharging through the n-channel MOSFET MNL62, the gate of which is connected to the node 51, is getting smaller little by little than that through the n-channel MOSFET MNL61, the gate of which is connected to the node 52. Therefore, the input setup by the setup enable signal φAXE can be applied directly to the amplification of the potential difference between the nodes 51 and 52.

If the sense signal φAXS is transited from the low state to the source voltage Vcc at instant t=t62, the n-channel MOSFET MNPD61 in the drive circuit 66 is turned on, thereby enabling the n-channel MOSFETs MNS61 and MNS62 in the sense amplifying circuit 61 to be driven. As a result, the potential difference between the nodes 51 and 52 having been amplified by the n-channel MOSFETs MNL61 and MNL62 is amplified through the p-channel MOSFETs MPS61 and MPS62 and the n-channel MOSFETs MNS61 and MNS62.

Therefore, if the potentials at the nodes 51 and 52 have been amplified by 0 V and source voltage Vcc, the n-channel MOSFET MNL62 of the cross-coupled n-channel MOSFETs MNL61 and MNL62 in the setup circuit 63 is turned off, so that the influences of the external input address signal An and the internal reference voltage signal Vref can be broken.

The potentials at the nodes 51 and 52 when the hold signal φAXH is high are transferred to input stages an and $\overline{an}$ of the output circuit 71 and then latched by the latching circuit 69. Then, if the address reset signal φAR is transited from a low state to a high state, the potential states at the nodes 51 and 52 are placed respectively on internal address output signals AXn and $\overline{AXn}$ as a valid address. Then, the hold signal φAXH is transited from the high state of 0 V for the holding of the valid address during the operation cycle at instant t=t63, thereby causing the output circuit 71 to be isolated from the sense amplifying circuit 61.

The access time period is defined as shown in FIG. 8.

As hereinbefore described, in accordance with the present invention, the address input buffer circuit for the semi-conductor storage device is capable of realizing a high speed operation by directly performing an address setup operation in order to remove the setup time period and therefore to shorten the access time period. In addition, the present invention may be applied to a data input buffer circuit requiring an operation which is similar to that of the address input buffer circuit.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. An address input buffer circuit for a semi-conductor storage device, comprising:
   input means being controlled by an external input address signal, an internal reference voltage signal and a setup enable signal;
   setup means connected to both stages of said input means;
   sense amplifying means connected to both stages of said setup means;
   a pair of charging means connected to said both stages of said setup means respectively and to a power source, said pair of charging means being controlled by a precharge signal;
   a pair of hold means connected to said both stages of said setup means respectively, said pair of hold means being controlled by a hold signal;
   drive means connected to said sense amplifying means, said drive means being controlled by a sense signal; and
   output means connected to said pair of hold means.

2. An address input buffer circuit for a semi-conductor storage device as set forth in claim 1, wherein said internal reference voltage signal represents a voltage generated for discrimination of an input level of a TTL potential in the device.

3. An address input buffer circuit for a semi-conductor storage device as set forth in claim 1, wherein said input means includes:
   a first n-channel MOSFET including its gate for inputting said external input address signal, its source for inputting said setup enable signal and its drain connected to said setup means; and
   a second n-channel MOSFET including its gate for inputting said internal reference voltage signal, its source for inputting said setup enable signal and its drain connected to said setup means.

4. An address input buffer circuit for a semi-conductor storage device as set forth in claim 1, wherein said setup means includes:
   a third n-channel MOSFET including its source connected to one stage of said input means, its drain connected to one stage of said sense amplifying means and its gate connected to the other stage of said sense amplifying means; and
   a fourth n-channel MOSFET including its source connected to the other stage of said input means, its drain connected to said other stage of said sense amplifying means and its gate connected to said drain of said third n-channel MOSFET.

5. An address input buffer circuit for a semi-conductor storage device as set forth in claim 1, wherein said pair of charging means include a fifth and a sixth n-channel MOSFETs respectively, each including its gate for inputting said precharge signal, its drain connected to said power source and its source connected to said setup means.

6. An address input buffer circuit for a semi-conductor storage device as set forth in claim 1, wherein said pair of hold means include a seventh and an eighth n-channel MOSFETs respectively, each including its drain connected to said setup means and its gate for inputting said hold signal, for switch-functioning.

7. An address input buffer circuit for a semi-conductor storage device as set forth in claim 1, wherein said sense amplifying means includes:
   a first p-channel MOSFET including its source connected to said power source, its drain connected to one stage of said setup means and its gate connected to the other stage of said setup means;
   a second p-channel MOSFET including its source connected to said power source, its drain connected to said other stage of said setup means and its gate connected to said one stage of said setup means;
   a ninth n-channel MOSFET including its source connected to said drive means, its drain connected to said one stage of said setup means and its gate connected to said other stage of said setup means; and
   a tenth n-channel MOSFET including its source connected to said drive means, its drain connected to said other stage of said setup means and its gate connected to said one stage of said setup means.

8. An address input buffer circuit for a semi-conductor storage device as set forth in claim 1, wherein said drive means includes an eleventh n-channel MOSFET including its drain connected to said sense amplifying means and its gate for inputting said sense signal.

9. An address input buffer circuit for a semi-conductor storage device as set forth in claim 1, wherein said output means includes:

latching means connected to output stages of said pair of hold means; and address reset means being controlled by an address reset signal.

* * * * *